(12) United States Patent
Cho et al.

(10) Patent No.: US 8,384,648 B2
(45) Date of Patent: Feb. 26, 2013

(54) LIQUID CRYSTAL DISPLAY DEVICE AND DRIVING UNIT THEREOF

(75) Inventors: Hyung Nyuck Cho, Incheon (KR); Soo Young Yoon, Gyeonggi-Do (KR); Min Doo Chun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1003 days.

(21) Appl. No.: 11/169,737

(22) Filed: Jun. 30, 2005

(65) Prior Publication Data

US 2006/0145998 A1    Jul. 6, 2006

(30) Foreign Application Priority Data

Dec. 31, 2004  (KR) .......................... 10-2004-0118470

(51) Int. Cl.
*G09G 3/36* (2006.01)

(52) U.S. Cl. ..................................................... 345/100
(58) Field of Classification Search ............ 345/87–100, 345/103; 349/73–83
See application file for complete search history.

(56) References Cited

U.S. PATENT DOCUMENTS

| | | | |
|---|---|---|---|
| 5,410,583 A * | 4/1995 | Weisbrod et al. ................ | 377/75 |
| 6,229,516 B1 * | 5/2001 | Kim et al. ...................... | 345/103 |
| 6,300,928 B1 * | 10/2001 | Kim ................................ | 345/92 |
| 2004/0150610 A1 * | 8/2004 | Zebedee et al. ................ | 345/100 |
| 2004/0217935 A1 * | 11/2004 | Jeon et al. ...................... | 345/100 |

* cited by examiner

*Primary Examiner* — Liliana Cerullo
(74) *Attorney, Agent, or Firm* — Birch, Stewart, Kolasch & Birch, LLP (57) ABSTRACT

A driving unit for a liquid crystal display device is provided. The driving unit includes a first group of driving stages and a second group of driving stages. A first driving stage of the first group receives a first gate start voltage. The first group of driving stages sequentially outputs scan signals according to a first clock signal. The scan signal outputted by one driving stage of the first group is sent to a next subsequent driving stage of the first group. A first driving stage of the second group receives a second start voltage. The second group of driving stages sequentially outputs the scan signals according to a second clock signal. The scan signal outputted by one driving stage of the second group is sent to a next subsequent driving stage of the second group. The driving stages of the first group and the second group alternately output the scan signals.

25 Claims, 7 Drawing Sheets

LIQUID CRYSTAL DISPLAY DEVICE AND DRIVING UNIT THEREOF

This Nonprovisional application claims priority under 35 U.S.C. §119(a) on Patent Application No. 10-2004-0118470 filed in Korea on Dec. 31, 2004, the entire contents of which are hereby incorporated by reference.

BACKGROUND OF THE INVENTION

1. Field of the Invention

The present invention relates to a liquid crystal display (LCD) device and a driving unit thereof, and particularly, to a liquid crystal display (LCD) device and driving unit capable of facilitating application of high resolution and improving image quality.

2. Description of the Background Art

Recently, since information was visually embodied, display devices which act as an interface between human being and information have been widely utilized. More particularly, because of the superior characteristics of liquid crystal display (LCD) devices such as clear image quality, low power consumption, light weight and the like, the LCD devices have been gradually utilized as a next-generation display device which can substitute for widely used Cathode Ray Tubes (CRTs).

Figure 1:
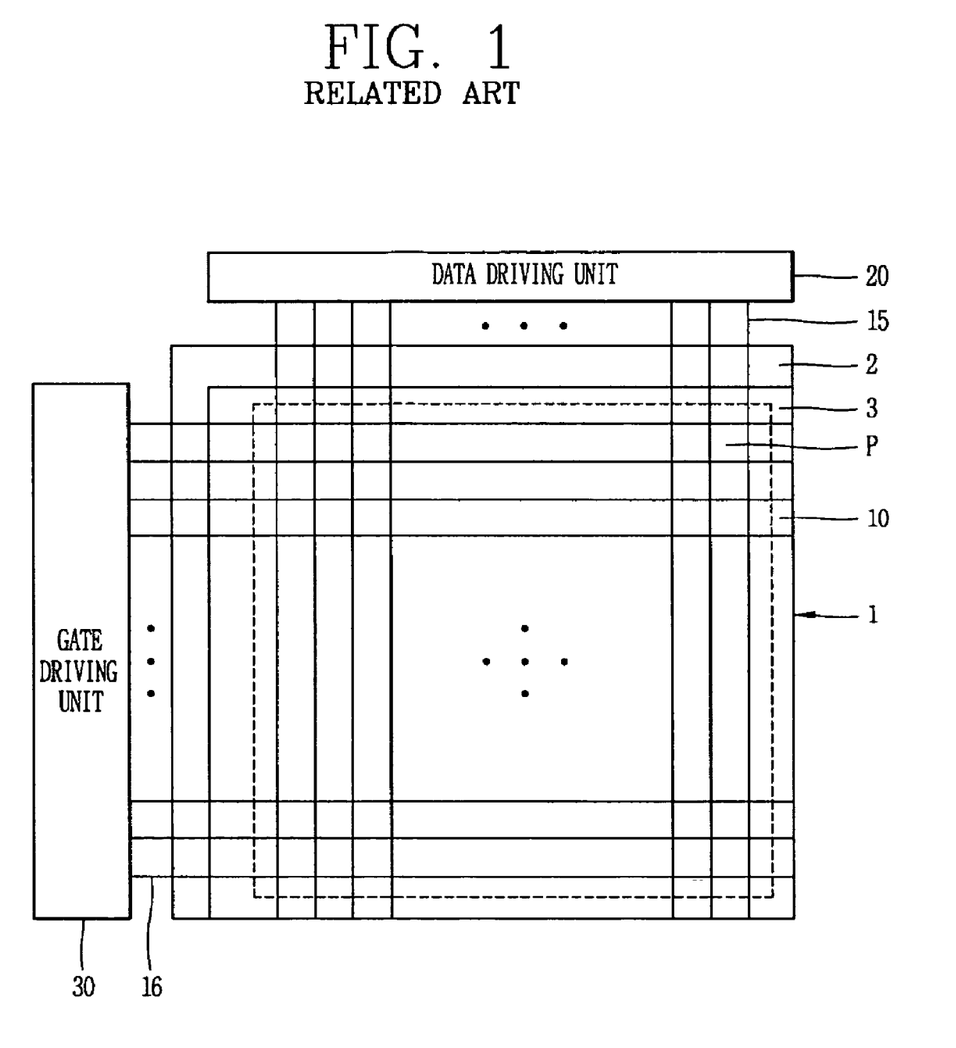
FIG. 1 illustrates a typical liquid crystal display device.

FIG. 1 schematically illustrates a typical liquid crystal display device. As illustrated in FIG. 1, a LCD device includes a liquid crystal display (LCD) panel 1 formed by attaching a thin film transistor array substrate 2 and a color filter substrate 3 to each other with a constant cell-gap, a plurality of data lines 15 and gate lines 16 arranged perpendicularly and longitudinally on the thin film transistor array substrate 2, a plurality of pixels P defined by crossing the data lines 15 and the gate lines 16, a data driving unit 20 for transferring image information to the pixels P through the data lines 15, and a gate driving unit 30 for applying scan signals to the pixels P through the gate lines 16.

The thin film transistor array substrate 2 on which the pixels P are arranged in a matrix has an image display unit 10 composed of the pixels P, for substantially displaying images thereon.

The data driving unit 20 is electrically connected to the image display unit 10 by the data lines 15, while the gate driving unit 30 is electrically connected to the image display unit 10 by the gate lines 30. The gate lines 16 and the data lines 15 are respectively electrically connected to the pixels P to form the image display unit 10.

The gate driving unit 30 sequentially outputs scan signals to the gate lines 16 and applies the scan signals to the pixels P connected to the gate lines 16. Thin film transistors TFTs provided to each pixel P are turned on by the scan signals. During this period for turning on the TFTs, the data driving unit 20 applies image information, i.e., data signals, to the pixels P through the turned-on TFTs.

The pixels P are provided therein with storage capacitors, by which a voltage of the image information, which has been applied to the pixels P when the TFTs are turned on by the scan signals, is charged to keep driving the pixels P for one frame when the TFTs are in an off state.

A plurality of driving voltages and control signals are inputted to the gate driving unit 30, which is then controlled by the control signals to sequentially output scan signals to the gate lines 16. As will be explained in FIG. 2A, the gate driving unit 30 is provided with a shift register unit for sequentially generating signals every horizontal period to thereby output the scan signals in sequence.

Figure 2A:
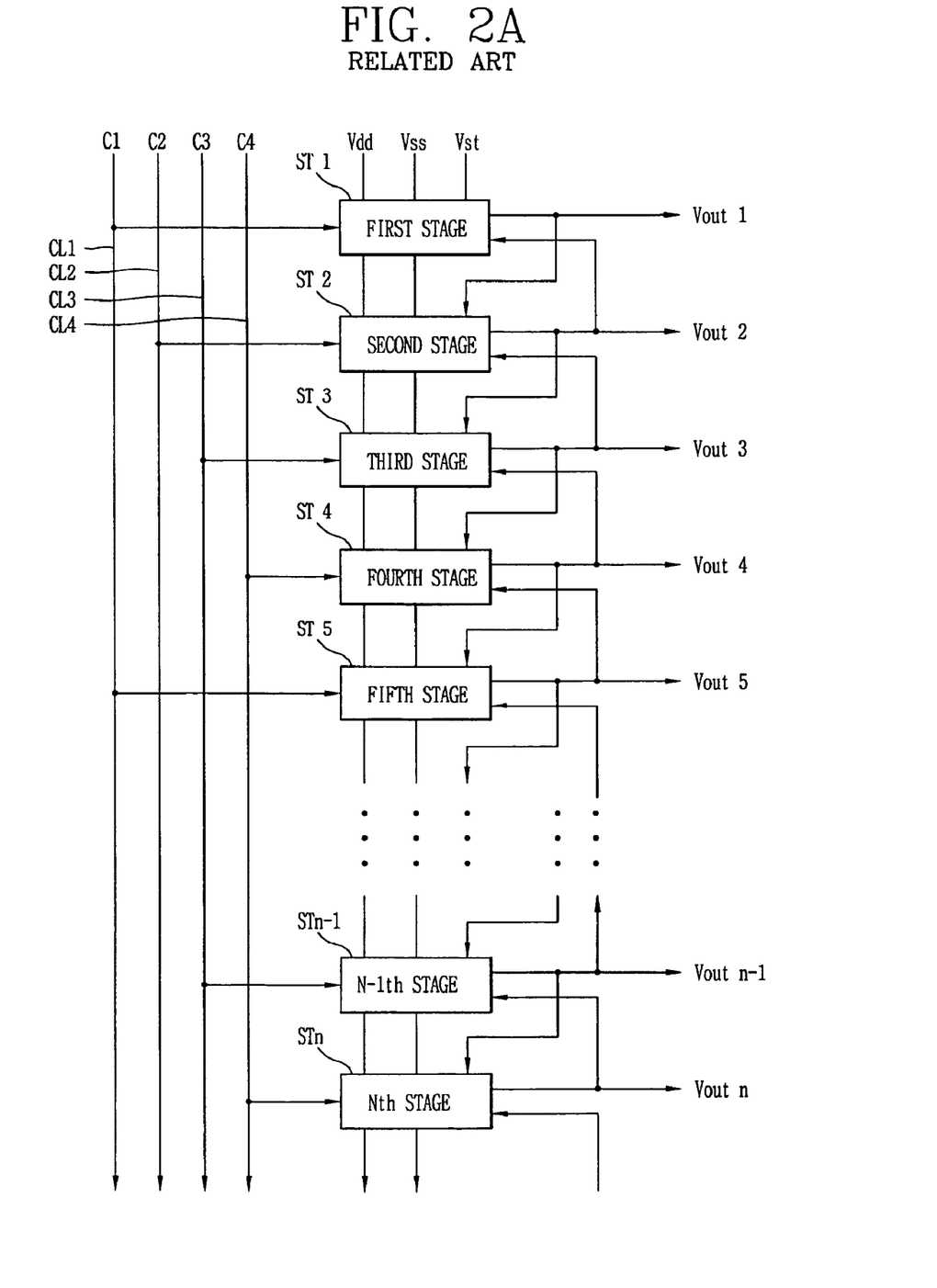
FIG. 2A illustrates a shift register unit of a gate driving unit.
Figure 2B:
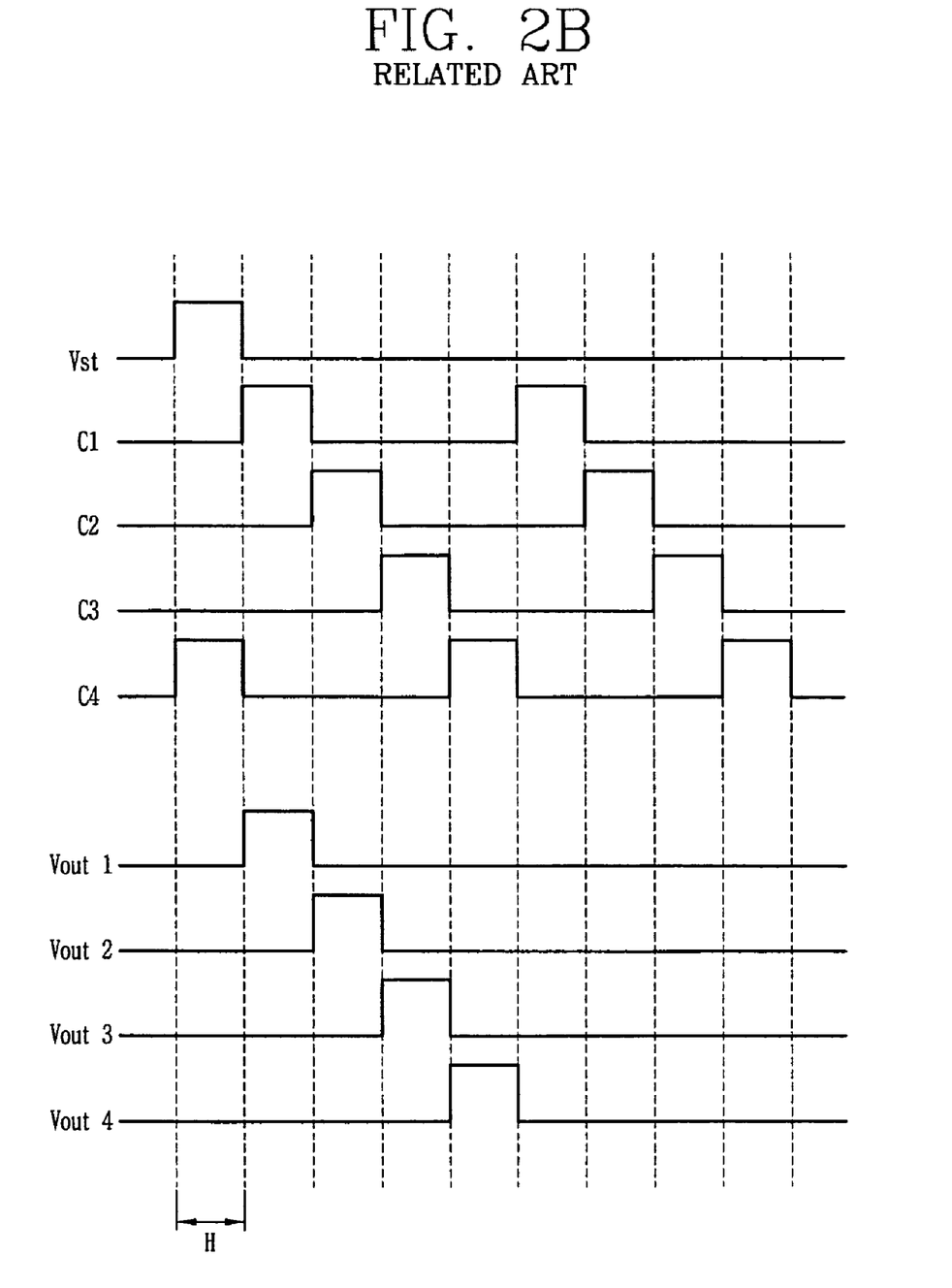
FIG. 2B shows the timing sequences of the signals shown in FIG. 2A.

FIG. 2A illustrates the shift register unit of the gate driving unit 30, and FIG. 2B shows the timing sequences of the signals shown in FIG. 2A. The shift register unit is driven by inputting a gate start voltage Vst, and is provided with a plurality of stages ST1 to STn for outputting scan signals Vout1 to Voutn according to a plurality of clock signals C1 to C4.

Four clock lines CL1 to CL4 are provided at one side of the shift register unit. The stages ST1 to STn are electrically connected to one of the four clock lines CL1 to CL4. A high potential voltage Vdd and a low potential voltage Vss are commonly applied to the stages ST1 to STn. The shift register unit may only use two clock lines CL1 and CL2.

An output side of each of the stages ST1 to STn is electrically connected to its next preceding stage as wells as to its next subsequent stage. Although not shown, each of the stages ST1 to STn has one-to-one connection with its respective gate line.

The stages ST1 to STn are preset by the gate start voltage Vst to be in a state of immediately outputting the scan signals Vout1 to Voutn by inputting the clock signals C1 to C4. The gate start voltage Vst is inputted only to the first stage ST1 and outputted to a timing controller. In each of the other stages ST2 to STn, the scan signals Vout1 to Voutn−1 of the next preceding stages ST1 to STn−1 perform a function as same as that of the gate start voltage Vst. That is, the scan signals Vout1 to Voun−1 of the next preceding stages ST1 to STn−1 are inputted to the next subsequent stages ST2 to STn to preset the corresponding stages ST2 to STn. Accordingly the corresponding stages ST2 to STn are synchronized with the clock signals C1 to C4 to be in a state that the scan signals Vout2 to Voutn can immediately be outputted.

On the other hand, each of the scan signals Vout2 to Voutn is applied to the next preceding stages ST1 to STn−1 to stop the output of the next preceding stages ST1 to STn−1. In addition, the scan signals Vout1 to Voutn are outputted to only one of the stages ST1 to STn.

FIG. 2B illustrates the timing sequences of the clock signals C1 to C4 applied to the shift register unit and of the scan signals Vout1 to Voutn controlled by the clock signals C1 to C4. When the gate start voltage Vst is firstly inputted and the clock signals C1 to C4 are then sequentially inputted to the stages ST1 to STn, the scan signals Vout1 to Voutn are sequentially outputted from the stages ST1 to STn. The scan signals Vout1 to Voutn are generated every horizontal period H.

Figure 3:
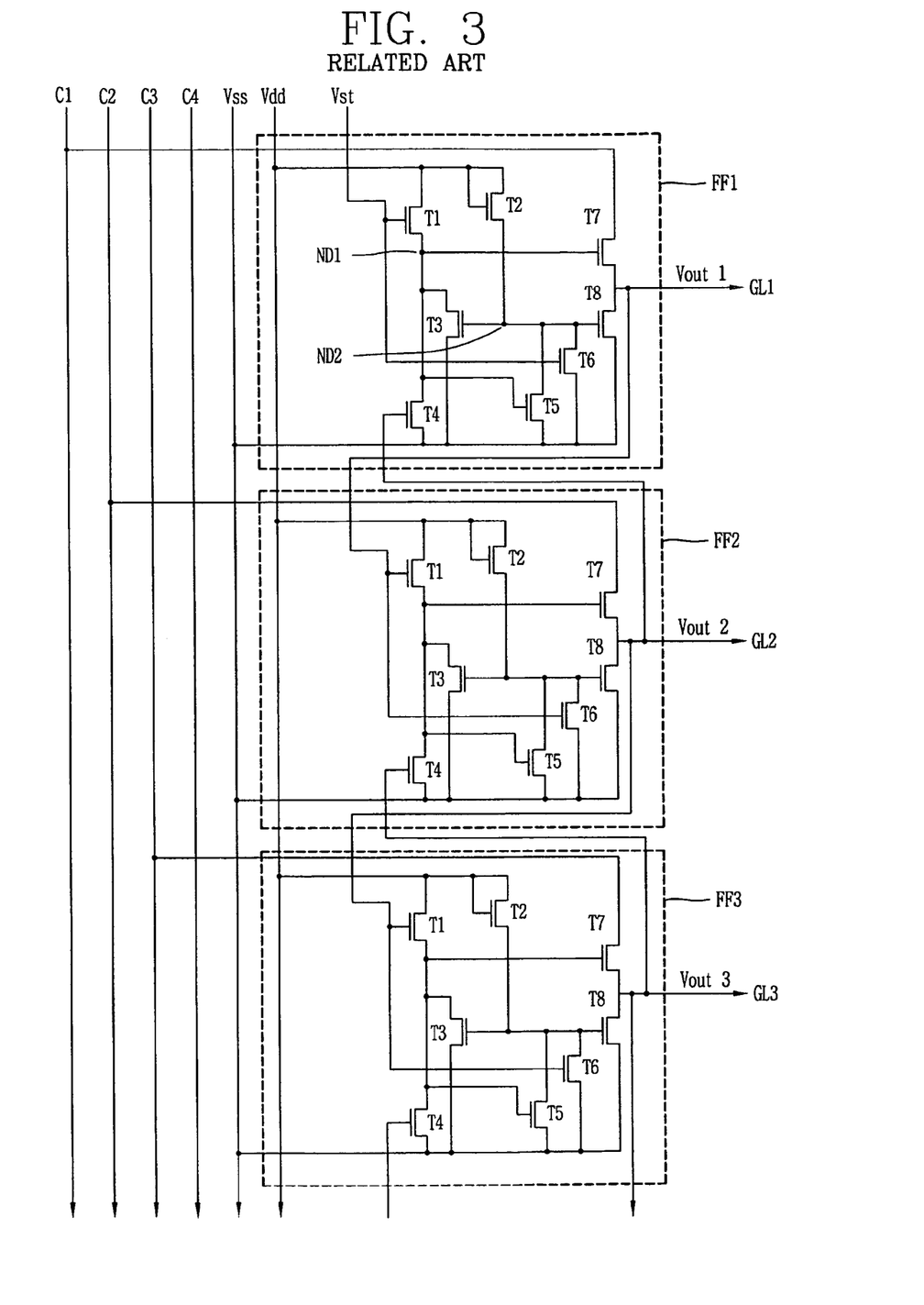
FIG. 3 illustrates an example of a circuit configuration of the shift register unit shown in FIG. 2A.

FIG. 3 illustrates an exemplary circuit configuration of the shift register unit shown in FIG. 2A. As illustrated in the drawing, the shift register unit is provided with a plurality of flip-flops FF1 to FF3 for outputting the scan signals Vout1 to Vout3 by inputting the clock signals C1 to C3 in a state that the gate start voltage Vst has been applied thereto. Each output side of the flip-flops FF1 to FF3 has one-to-one connection with the gate lines GL1 to GL3 arranged on a substrate in a lateral direction.

Each of the flip-flops FF1 to FF3 includes: a second transistor T2 turned on by a high potential voltage Vdd, for charging a second Node ND2; a first transistor T1 turned on/off by the gate start voltage Vst, for discharging the second Node ND2 and for charging a first Node ND1; a seventh transistor T7 electrically connected to one side of the charged first Node ND1 and turned on/off by a voltage charged in the first Node ND1, for outputting scan signals Vout1 to Voutn according to clock signals C1 to C4; a fourth transistor T4 turned on/off by signals outputted from a next subsequent flip-flop, for discharging the first Node ND1 and recharging the second Node ND2, and an eighth transistor T8 turned on/off by a voltage charged in the second Node ND2, for lowering the voltage level of the scan signals Vout1 to Voutn to a low potential voltage. The first to eighth transistors T1 to T8 are all N-type.

The first Node ND1 electrically connects a source electrode of the first transistor T1, a gate electrode of the seventh transistor T7 and a drain electrode of the fourth transistor T4. The second Node ND2 electrically connects a source electrode of the second transistor T2 and gate electrodes of the eighth and third transistors T8 and T3.

The output of the flip-flops FF1 to FF3 is controlled by potentials of the first Node ND1 and the second Node ND2. That is, when the first Node ND1 is in a high potential, the seventh transistor T7 is turned on to transit the scan signals Vout1 to Vout3 into high potential levels, while transiting the scan signals Vout1 to Vout3 into low potential levels when the eighth transistor T8 is turned on.

The scan signals Vout1 to Vout3 of the flip-flops FF1 to FF3 are supplied to the gate lines GL1 to GL3 and simultaneously applied to the next subsequent flip-flops FF2 to FF4 (not shown) to thereby perform a function as same as that of the gate start voltage Vst applied to the first flip-flop FF1. That is, the first transistor T1 of the current flip-flops FF1 to FF3 is turned on to charge the first Node ND1. Furthermore, the scan signals of the flip-flop FF2 to FF4 are transferred to the next preceding flip-flops FF1 to FF3 to discharge the first Node ND1 of the next preceding flip-flops FF1 to FF3. If the first Node ND1 of the next preceding flip-flops FF1 to FF3 is not completely discharged, when the current flip-flops output scan signals, minute signals can still be outputted from the next preceding flip-flops. In other words, an abnormal output of the scan signals of the next preceding flip-flops FF1 to FF3 can be prevented by completely discharging the first Node ND1. Thus, the scan signals of the current flip-flops control the output of both the next preceding and the next subsequent flip-flops.

Recently, LCD devices with large dimension and high resolution have been developed. In order to make the devices lighter, a driving unit which has been installed in a LCD panel as IC chip (Integrated Circuit Chip) type is integrated with the LCD panel. Thus, the driving circuit integrated with the LCD panel is generally formed of amorphous silicon transistor.

On the other hand, because the number of pixels is increased to enhance the resolution of screen, the number of the gate lines is also increased to control the increased pixels. Accordingly, more flip-flops should be formed corresponding to the increased number of gate lines. Since the number of the gate lines is increased, the scanning frequency has to be increased. In other words, a horizontal period for applying scan signals to each gate line for one frame is reduced.

When the horizontal period for applying scan signals to each gate line is reduced, a time assigned to each flip-flop for outputting scan signals is also reduced. Therefore, it would be difficult to ensure a sufficient time for charging the first Node ND1. In the state that the first Node ND1 is not enough charged, a gate voltage for turning on the seventh transistor T7 is lowered, and accordingly current flowing through the seventh transistor T7 is also reduced. As a result, potential levels of the scan signals rise at a lower speed, which requires a longer time period (rising time) to raise the scan signals up to high potential levels. That is, pulses of the scan signals fall with delay.

Similarly, when the horizontal period is reduced, it is difficult to ensure a sufficient time taken by charging the second Node ND2. As a result, the eighth transistor T8 is not completely turned on, which causes limitation on electric charge which is discharged through the eighth transistor T8, thereby taking a longer time period (falling time) to lower the potential levels of the scan signals. Furthermore, resistance and capacitance elements of the increased gate lines increase a load in the shift register unit to lengthen the rising time and the falling time of the scan signals. That is, pulses of the scan signals Vout1 to Vout3 fall with delay.

Thus, when the pulses of the scan signals Vout1 to Vout3 fall with delay by the incomplete charging of the first Node ND1 and the second Node ND2, each flip-flop outputs the scan signal which does not have desired potential level for the gate line. Accordingly, when the scan signals are applied to the gate lines, image quality of the LCD device may be degraded. Especially, in the driving circuit-integrated LCD panel applying amorphous silicon transistor thereto, due to its lower electron mobility, the rising time and the falling time of the scan signals may be longer.

Moreover, when the rising time or the falling time of the scan signals is lengthened, waveforms of the scan signals fall with delay to maintain high potential levels for a long time, thereby unnecessarily turning on TFTs. In this case, image information may be applied to pixels through the TFTs which should have been turned off. This may cause degradation of image quality. In addition, when the waveforms of the scan signals fall with delay, the time period for outputting the scan signals have to be further reduced to prevent adjacent scan signals from being overlapped with one another, which makes it difficult to fabricate a LCD device with high resolution.

SUMMARY OF THE INVENTION

Therefore, an object of the present invention is to provide a driving unit for a liquid crystal display device in which flip-flops of a shift register unit are divided into two groups and driven so as to ensure a sufficient charging time for each flip-flop, whereby a rising time and a falling time of output signals are reduced to output high potential voltages with desired levels as the output signals.

To achieve these and other advantages and in accordance with the purpose of the present invention, as embodied and broadly described herein, there is provided a driving unit for a liquid crystal display device comprising: a plurality of gate lines and data lines arranged perpendicularly and longitudinally on a substrate; a plurality of pixels arranged on the substrate, corresponding to the gate lines; stages of a first group initially set by a first gate start voltage and synchronized with clock signals, for sequentially applying output signals to the gate lines; and stages of a second group initially set by a second gate start voltage and synchronized with clock signals, for sequentially applying output signals to the gate lines, wherein each $N^{th}$ stage of the first and second groups is set by output signals of each $N-1^{th}$ stage thereof, an output of each $N-1^{th}$ stage of the first and second groups is stopped by output signals of each $N^{th}$ stage of the first and second groups, and scan signals of the stages of the first group and the stages of the second group are alternately outputted.

An embodiment of the driving unit for a liquid crystal display device comprises a first group of driving stages, a first driving stage of the first group receiving a first gate start voltage, the first group of driving stages sequentially outputting scan signals according to a first clock signal, the scan signal outputted by one driving stage of the first group being sent to a next subsequent driving stage of the first group; and a second group of driving stages, a first driving stage of the second group receiving a second start voltage, the second group of driving stages sequentially outputting the scan signals according to a second clock signal, the scan signal outputted by one driving stage of the second group being sent to a next subsequent driving stage of the second group; wherein the driving stages of the first group and the second group alternately output the scan signals.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

To achieve objects of the present invention, a driving unit for a liquid crystal display (LCD) device of an embodiment of the present invention includes: a first group of stages initially set by a first gate start voltage and synchronized with clock signals, for sequentially applying scan signals to the gate lines, and a second group of stages initially set by a second gate start voltage and synchronized with clock signals, for sequentially applying output signals to the gate lines. Each $N^{th}$ stage of the first and second groups is set by output signals of each $N-1^{th}$ stage (i.e., the next subsequent stage of the first or second group) thereof. An output of each $N-1^{th}$ stage of the first and second groups is stopped by output signals of each $N^{th}$ stage of the first and second groups. In addition, output signals of the stages of the first group and the stages of the second group are alternately outputted.

Figure 4A:
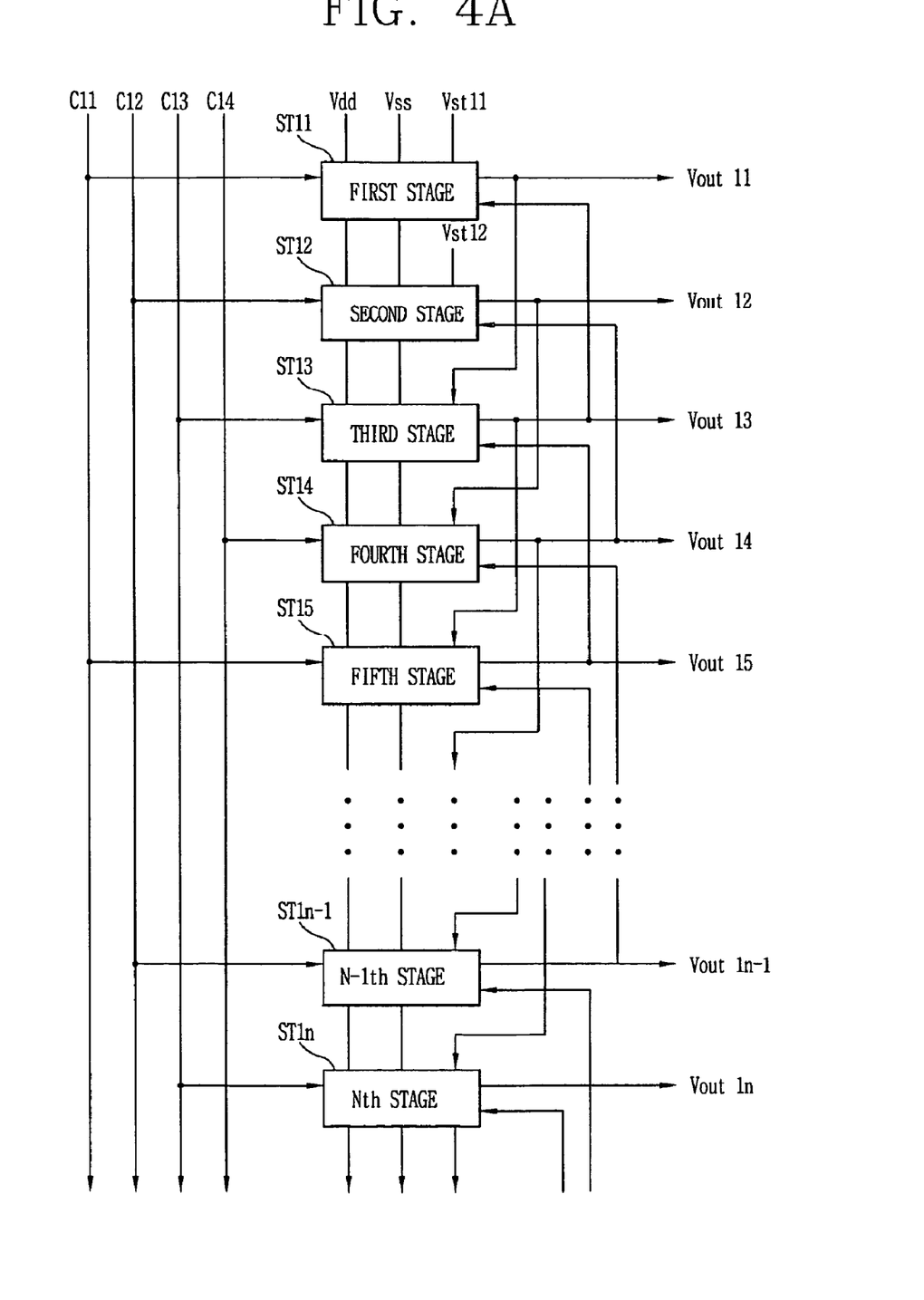
FIG. 4A illustrates a driving unit for a liquid crystal display device according to an embodiment of the present invention.
Figure 4B:
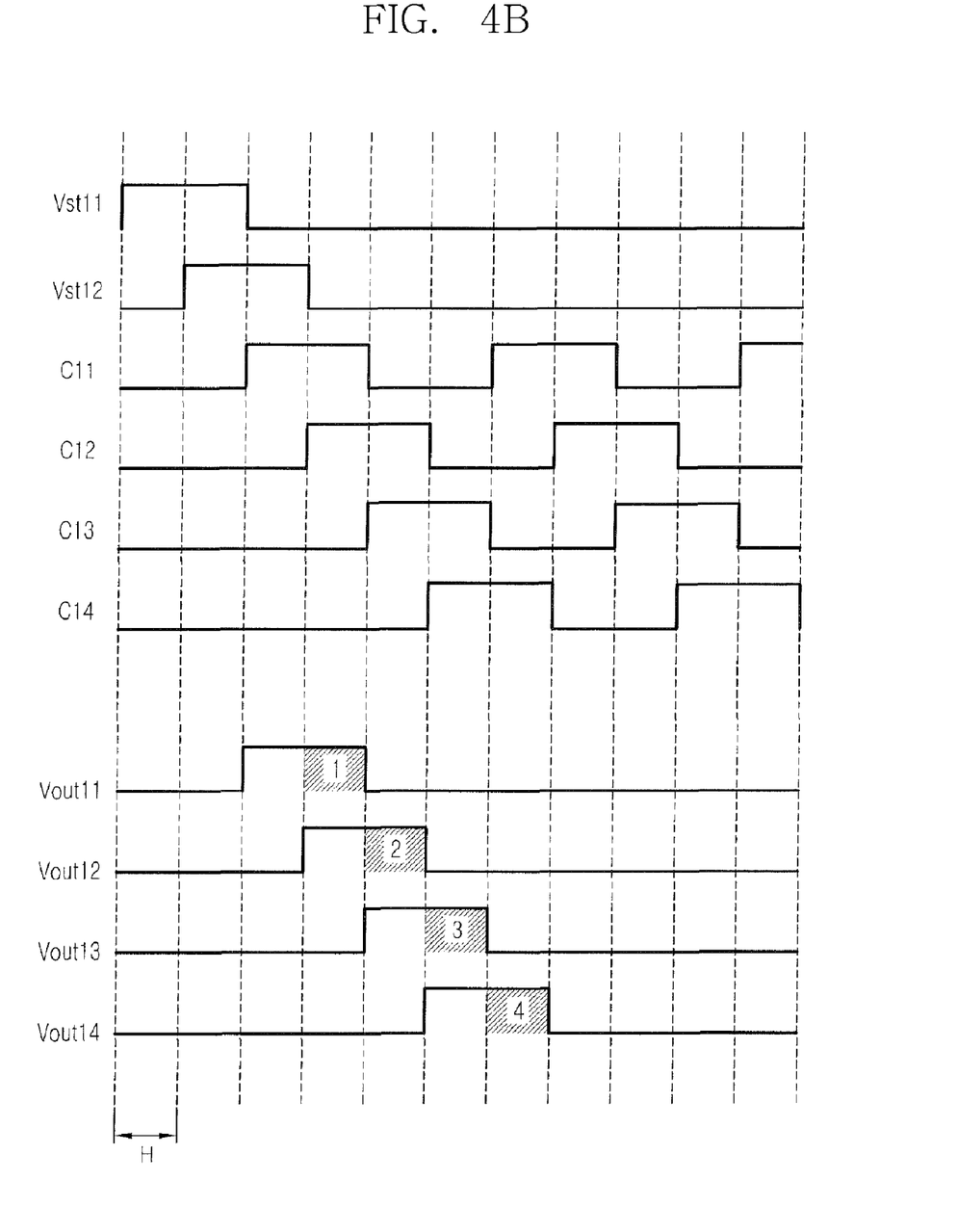
FIG. 4B shows the timing sequences of the signals shown in FIG. 4A.

FIG. 4A illustrates the driving unit for the LCD device according to an embodiment of the present invention, and FIG. 4B shows the timing sequences of the signals shown in FIG. 4A.

Although not shown, a plurality of data lines are arranged on a substrate in a longitudinal direction with a constant distance from each adjacent data line, and a plurality of gate lines in a perpendicular direction with a constant distance from each adjacent gate line. A plurality of regions defined by the gate lines and data lines crossing in a perpendicular direction denote pixels, each of which is electrically connected to the gate lines and data lines to thusly response to the scan signals applied through the gate lines. As a result, image information is applied to each pixel through the data lines.

With reference to FIG. 4A, a shift register unit includes a plurality of stages ST11 to ST1n for outputting scan signals Vout11 to Vout1n, respectively, and applying them to the gate lines in sequence. The stages ST11 to ST1n are flip-flops in the illustrated embodiment. The shift register unit outputs the scan signals Vout11 to Vout1n every horizontal period to the gate lines in sequence.

The stages ST11 to ST1n are divided into a first group of stages ST11, ST13, ST15, . . . , ST1n for sequentially outputting first scan signals Vout11, Vout13, Vout 15, . . . , Vout1n according to clock signals C11 and C13 in a state that a first gate start voltage Vst11 is initially applied thereto, and a second group of stages ST12, ST14, ST16, . . . ST1n-1 for sequentially outputting second scan signals Vout12, Vout14, . . . , Vout1n-1 according to clock signals C12 and C14 in a state that a second gate start voltage Vst12 is initially applied thereto. The stages of the first group ST11, ST13, ST15, . . . , ST1n and the stages of the second group ST12, ST14, ST16, . . . , ST1n-1 respectively have one-to-one connection with the gate lines.

The stages of the first group ST11, ST13, ST15, . . . , ST1n include odd numbered stages, and the stages of the second group ST12, ST14, . . . , ST1n-1 include even numbered stages It is also possible to construct the shift register in a manner vice versa.

The stages of the first group ST11, ST13, ST15, . . . , ST1n and the stages of the second group ST12, ST14, . . . , ST1n-1, as shown in the drawing, are initially driven by independent gate start voltages Vst11 and Vst12.

The stages of the first group ST11, ST13, ST15, . . . , ST1n and the stages of the second group ST12, ST14, . . . , ST1n-1 alternately output scan signals Vout11 to Vout1n every horizontal period. However, considering an overall shift register unit, the scan signals Vout11 to Vout1n are sequentially outputted every horizontal period.

The first group has the same configuration and operation as the second group, and thus only the first group will now be explained for simplicity.

Outputs of the stages of the first group ST13, ST15, . . . , ST1n are electrically connected to next preceding stages ST11, ST13, ST15, . . . , ST1n-2 and next subsequent stages ST15, ST17, . . . , ST1n. When a first stage ST11, a first stage of the first group, receives a first clock signal C11 in a state that the first gate start voltage Vst11 is applied thereto, the first group starts up its operation. The first stage ST11 is synchronized with the first clock signal C11 to output a scan signal Vout11, which is then also applied to a third stage ST13, which is a second stage of the first group, as well as being applied to a gate line. At this time, the scan signal Vout11 of the first stage ST11 applied to the third stage ST13 performs a function as same as that of the gate start voltage. That is, when a third clock signal C13 is applied thereto, the third stage ST13 is preset into a state of outputting a scan signal Vout13 immediately.

Scan signals Vout13, Vout15, . . . , Vout1n outputted from each stage ST13, ST15, . . . , ST1n control the output from the next preceding stages ST11, ST13, ST15, . . . . ST1n-2 and the next stages ST15, ST17, . . . , ST1n. That is, the scan signals Vout13, Vout15, . . . , Vout1n outputted from each stage ST13, ST15, . . . , ST1n stop the output from the next preceding stages ST11, ST13, ST15, . . . , ST1n-2 and get ready for the output from the next stages ST15, ST17, . . . , ST1n.

For instance, the scan signal Vout13 outputted from the third stage ST13 is applied to the first stage ST11, resulting in stopping the output from the first stage ST11, while being applied to a fifth stage ST15 to thereby allow the fifth stage ST15 to be in a state of outputting a scan signal Vout15 immediately according to the first clock signal C11. As a result, in the current horizontal period, only the scan signal Vout13 is outputted from the third stage ST13 in the first group. Each stage ST11, ST13, ST15, ..., ST1n operates according to the same method.

Considering the overall shift register unit, since the stages of the first group ST11, ST13, ST15, ..., ST1n and the stages of the second group ST12, ST14, ..., ST1n-1 are alternately arranged, an output from a Kth stage stops an output from a K-2$^{th}$ stage and presets a K+2$^{th}$ stage.

On the other hand, the first clock signal C11 and the third clock signal C13 are sequentially applied to the stages of the first group ST11, ST13, ST15, ..., ST1n, while the residual second clock signal C12 and fourth clock signal C14 are sequentially applied to the stages of the second group ST12, ST14, ..., ST1n-1. Thus, the clock signals C11 to C14 are divided into two groups to be applied to the stages of the first group ST11, ST13, ST15, ..., ST1n and the stages of the second group ST12, ST14, ..., ST1n-1. In other words, the stages of the first group ST11, ST13, ST15, ..., ST1n and the stages of the second group ST12, ST14, ..., ST1n-1 are alternately arranged in their overall configuration, but the two groups are independently driven.

The operation of the shift register unit in this embodiment will now be explained in more detail with reference to driving waveforms. As illustrated in FIG. 4B, a first gate start voltage Vst11 is applied to the first stage ST11 which is the first stage of the first group for two horizontal periods H. After one more horizontal period H, a second gate start voltage Vst12 is applied to the second stage ST12, a first stage of the second group, for two horizontal periods H. That is, the first gate start voltage Vst11 is overlapped with the second start voltage Vst12 for one horizontal period H and has a phase difference for one horizontal period H.

After the first gate start voltage Vst11 is outputted for two horizontal periods H, the first clock signal C11 and the third clock signal C13 are alternately applied to the first stage ST11 for two horizontal periods H. Thereafter, while pulses of the first clock signal C11 and the third clock signal C13 maintain high potentials, the stages of the first group ST11, ST13, ST15, ..., ST1n sequentially output first scan signals Vout11 and Vout13.

Similarly, after the second gate start voltage Vst12 is outputted for two horizontal periods H, the second clock signal C12 and the fourth clock signal C14 are alternately applied to the stages of the second group ST12, ST14, ..., ST1n-1 every two horizontal periods H. Corresponding to high potential sections of the second clock signal C12 and the fourth clock signal C14, the stages of the second group ST12, ST14, ST1n-1 sequentially output second scan signals Vout12 and Vout14. Each pulse of the scan signals Vout11 to Vout14 has a high potential section for two horizontal periods H.

The first gate start voltage Vst11 is applied ahead of the first clock signal C11 for two horizontal periods H, and the first clock signal C11 is applied ahead of the third clock signal C13 for two horizontal periods H. The second gate start voltage Vst12 is applied ahead of the second clock signal C12 for two horizontal periods H, and the second clock signal C12 is applied ahead of the fourth clock signal C14 for two horizontal periods H. However, considering the overall driving of the shift register unit, since the first gate start voltage Vst11, the second gate start voltage Vst12, the first to fourth clock signals C11 to C14 are sequentially outputted every horizontal period H, the scan signals Vout11 to Vout14 are also sequentially outputted every single horizontal period H. Since the high potential section of a pulse of each scan signal Vout11 to Vout14 lasts for two horizontal periods H, adjacent scan signals (e.g., Vout11 and Vout12) overlap for one horizontal period H in their high potential section, as shown in FIG. 4B.

Thus, the fact that two scan signals are overlapped therewith for a horizontal period H denotes that the scan signals are simultaneously outputted to two gate lines every horizontal period, which indicates that image information can be supplied to pixels corresponding to the two gate lines. However, the image information is supplied to pixels in a row unit. Accordingly, if simultaneously supplying the image information to two rows of pixels at a section in which two scan signals maintain high potential levels, an erroneous driving such as data impact may occur. Therefore, in order to normally drive a LCD device, the image information should be supplied to pixels corresponding to each gate line for a non-overlapped section of the scan signals.

As illustrated in FIG. 4B, the image information is supplied to the pixels only for one horizontal period H of the two horizontal periods of the scan signals Vout11 to Vout14. Biased first to fourth sections correspond to actual sections for supplying the image information to pixels among the whole high potential sections of each scan signal Vout11 to Vout14. Accordingly, the image information is supplied to pixels only for partial sections among the whole high potential sections of each scan signal, which results in preventing sections for supplying the image information to two pixels connected to adjacent gate lines. Therefore, degradation of image quality due to an erroneous driving can be prevented.

On the other hand, the shift register unit may also be formed when forming gate lines and data lines on the substrate, thereby integrating a driving circuit with a LCD panel.

Figure 5:
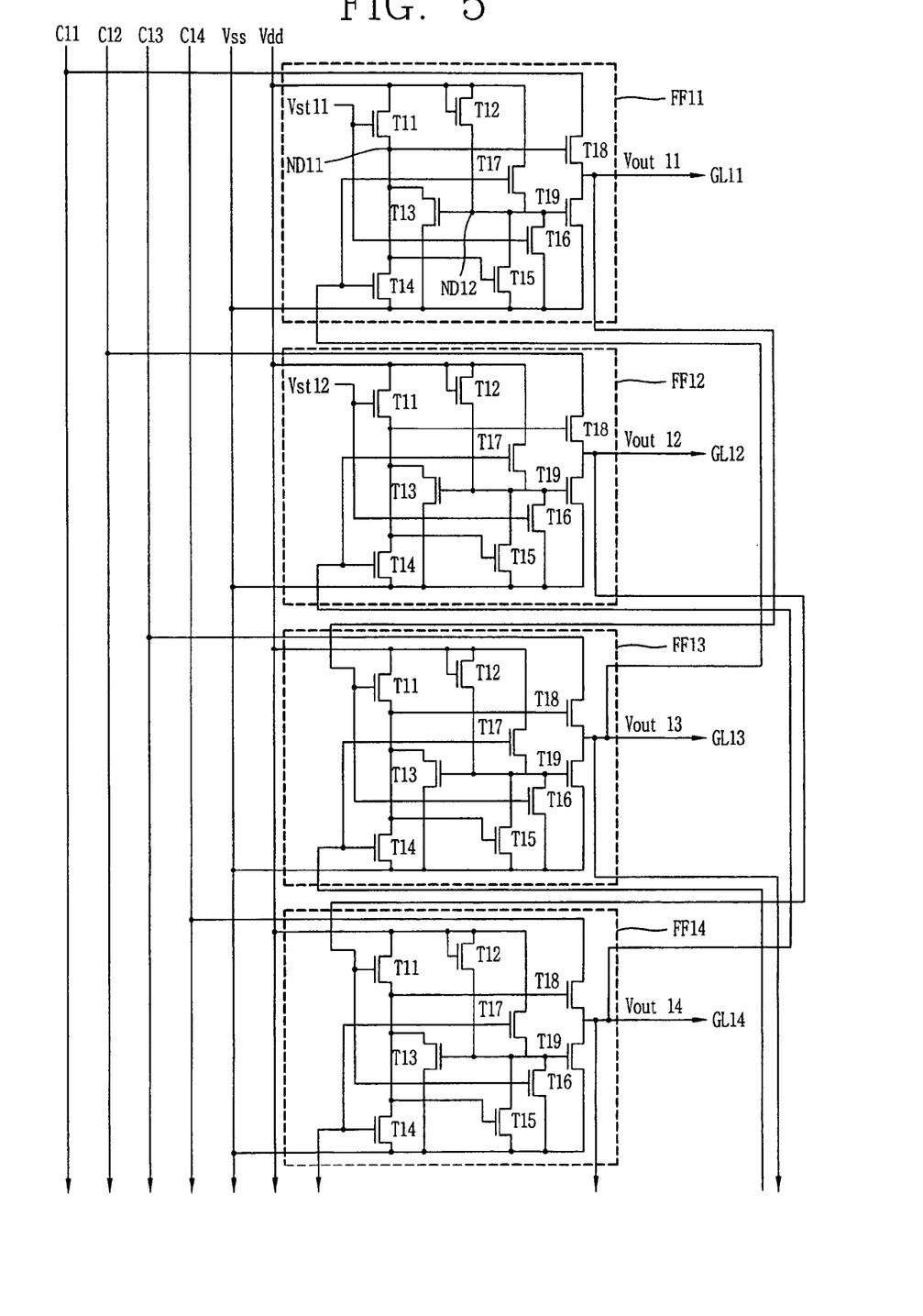
FIG. 5 illustrates a circuit configuration of a driving unit for a liquid crystal display device according to an embodiment of the present invention.

FIG. 5 illustrates a circuit configuration of a driving unit for a LCD device according to the present invention. A circuit shown in FIG. 5 is an example for explaining an embodiment of the present invention, which may be replaced with other circuits for performing the same function thereas. Flip-flops FF11 to FF14, particularly, RS flip-flops, are applied to each stage of the shift register unit.

The shift register unit includes a plurality of flip-flops FF11 to FF14 electrically connected to one another. Each of the flip-flops FF11 to FF14 includes a plurality of transistors T11 to T19. The flip-flops FF11 to FF14 are electrically connected to another flip-flop to control an output another flip-flop. A relation between these flip-flops FF11 to FF14 will now be explained with reference to an arbitrary N$^{th}$ flip-flop.

In the shift register unit in which a plurality flip-flops are arranged, an N$^{th}$ flip-flop includes transistors T11-T19. The first transistor receives a scan signal outputted from an N-2$^{th}$ flip-flop (i.e., the second next subsequent flip-flop) for charging a first Node ND1. The second transistor T12 is for charging a second Node ND12. The third transistor T13 receives a voltage of the second Node ND12 having charged for inducing a discharge of the first Node ND11. The fourth transistor T14 receives a scan signal outputted from an N+2$^{th}$ flip-flop (i.e., the second next subsequent flip-flop) for discharging the first Node ND11. The fifth transistor T15 receives a voltage applied through the first transistor T11 for discharging the second Node ND12. The sixth transistor T16 receives a scan signal outputted from the N-2$^{th}$ stage for discharging the second Node ND12. The eighth transistor T18 receives a voltage at the first Node ND11. When the first Node ND11 is charged, the eighth transistor T18 outputs a scan signal. When the first Node ND11 is discharged by the fourth transistor T14, the eighth transistor T18 is turned off. The ninth transistor T19 receives a voltage at the second Node ND12. The ninth transistor T19 turns the scan signal outputted through the eighth transistor T18 into a low potential level when the first Node ND11 is discharged by an output signal from the N+2$^{th}$ flip-flop. The first to ninth transistors T11 to T19 are configured with the same type, namely, an N-type transistor in this embodiment, but may be configured with P-type transistor all together.

A high potential voltage Vdd and a low potential voltage Vss are commonly applied to each flip-flop FF11 to FF14, and one of a plurality of clock signals C11 to C14 is also applied thereto.

The first Node ND11 electrically connects a source electrode of the first transistor T11, a drain electrode of the fourth transistor T14 and a gate electrode of the eighth transistor T18 to make them all be equipotential. Furthermore, the second Node ND12 electrically connects a source electrode of the second transistor T12, a gate electrode of the third transistor T13 and a gate electrode of the ninth transistor to make them all be equipotential. The first Node ND11 and the second Node ND12 are charged or discharged when the first to seventh transistors T11 to T17 are turned on or off, thereby controlling an output of scan signals Vout11 to Vout14.

As illustrated in FIG. 5, a gate electrode and a drain electrode of the second transistor T12 of the first flip-flop FF11 are electrically connected and a high potential voltage Vdd is commonly applied thereto. That is, the second transistor T12 is operated as a diode. Therefore, since the second transistor T12 maintains its turn-on state at any time, the high potential voltage Vdd is always applied to the second Node ND12 through the second transistor T12. However, when the first transistor T11 is turned on by the first gate start voltage Vst11, the high potential voltage Vdd is applied to the first Node ND11 through the first transistor T11 to thereby charge the first Node ND1. At the same time, the fifth and sixth transistors T15 and T16 are turned on to discharge the second Node ND12 through the fifth and sixth transistor T15 and T16.

As illustrated in FIG. 4B, since the first gate start voltage Vst11 is applied to the first transistor T11 for two horizontal periods, the first Node ND1 also maintains a high potential level for two horizontal periods. While the first Node ND11 is charged to maintain the high potential level, a high voltage is continuously applied to the gate electrode of the eighth transistor T18. As a result, the eighth transistor T18 also maintains its turn-on state.

After the first flip-flop FF11 receives the first gate start voltage Vst 11 for one horizontal period, the second flip-flop FF12 receives the second gate start voltage Vst12. The first transistor T11 of the second flip-flop FF12 is turned on by the second gate start voltage Vst12, and accordingly the first Node ND11 is charged and the second Node ND12 is discharged. At this time, the first Node ND11 of the third flip-flop FF13 maintains its charged state.

After the second gate start voltage Vst12 is applied to the second flip-flop FF12 for one horizontal period, the eighth transistor T18 of the first flip-flop FF11 receives the first clock signal C11. Because the eighth transistor T18 has been turned on by the voltage of the first Node ND11 charged by the first gate start voltage Vst11 two horizontal periods ago, the first flip-flop FF11 responses to the first clock signal C11 to immediately output the scan signal Vout11. The first Node ND11 is sufficiently charged for two horizontal periods, and accordingly its voltage level is in a state of being raised up to a desired voltage level. As a result, the gate voltage for turning on the eighth transistor T18 rises and the flowing current is also increased. Therefore, a pulse of the scan signal Vout11 outputted through the eighth transistor T18 is rapidly raised up to a high voltage level. That is, the rising time of the pulse is shortened.

The scan signal Vout11 outputted from the first flip-flop FF11 is supplied to the gate line GL11 and also turns on the first transistor T11 of the third flip-flop FF13. The third flip-flop FF13 also charges the first Node ND11 by the voltage applied through the first transistor T11 which has been turned on and discharges the second Node ND12.

After the first clock signal C11 is applied to the first flip-flop FF11 for one horizontal period, when the eighth transistor T18 of the second flip-flop FF12 receives the second clock signal C12, the eighth transistor T18 which has been turned on two horizontal periods ago outputs the scan signal Vout12. The scan signal Vout12 outputted from the second flip-flop FF12 is applied to the gate line GL12 and also turns on the first transistor T11 of the fourth flip-flop FF14 to charge the first Node ND11 of the fourth flip-flop FF14 and to discharge the second Node ND12.

After the first and second flip-flops FF11 and FF12 sequentially output the scan signals Vout11 and Vout12 every horizontal period and one more horizontal period further passes, when the third clock C13 is applied to the eighth transistor T18 of the third flip-flop FF13, the third flip-flop FF13 outputs the scan signal Vout13. Similar to the first Nodes of the first and second flip-flops FF11 and FF12, the first Node ND11 of the third flip-flop FF13 has been sufficiently charged for two horizontal periods. As a result, a pulse of the scan signal Vout13 outputted through the eighth transistor T18 is rapidly raised to a high potential level.

A source electrode of the eighth transistor T18 of the third flip-flop FF13 is electrically connected to the fourth transistor T14 of the first flip-flop FF11 which is a flip-flop at the second next preceding stage to the third flip-flop FF13. The scan signal Vout13 outputted from the third flip-flop FF13 is applied to the gate line GL13 and also applied to the gate electrode of the fourth transistor T14 of the first flip-flop FF11. The scan signal Vout13 of the third flip-flop FF13 turns on the fourth transistor T14 of the first flip-flop FF11 to discharge the first Node ND11 of the first flip-flop FF11. When the first Node ND11 is discharged to be fallen into a low voltage, the fifth transistor T15 is turned off. As a result, the second Node ND12 is recharged to a high voltage.

Accordingly, the eighth transistor T18 is turned off due to the discharge of the first Node ND11, and the scan signal Vout11 having outputted through the eighth transistor T18 is transited into a low potential level by the ninth transistor T19 which is turned on by the voltage of the second Node ND12. The first Node ND11 and the second Node ND12 are alternately charged and discharged to alternately turn on or off the eighth transistor T18 and the ninth transistor T19, thereby resulting in controlling an output from the flip-flops FF11 to FF14.

On the other hand, a seventh transistor T17 may further be included in each flip-flop FF11 to FF14 to accelerate the charging of the second Node ND12 and reduce a load of the second transistor T12. A source electrode of the seventh transistor T17 is connected to the source electrode of the second transistor T12, a gate electrode thereof is connected to the gate electrode of the fourth transistor T14, and a drain electrode thereof receives the high potential voltage Vdd. Therefore, current which flows in the second Node ND12 only through the second transistor T12 can be dispersed to the seventh transistor T17, which results in increasing a charging speed of the second Node ND12 and preventing degradation of the second transistor T12.

The first flip-flop FF11 and the third flip-flop FF13 are driven as described above. The second flip-flop FF12 and fourth flip-flop FF14 which have not been explained are driven as same as the flip-flops FF11 and FF13.

As compared with the first gate start voltage Vst11 applied to the first flip-flop FF11 which is a first flip-flop of the odd numbered flip-flops FF11 and FF13, the second gate start voltage Vst12 applied to the second flip-flop FF12 which is a first flip-flop of the even numbered flip-flops FF12 and FF14 is shifted as long as one horizontal period and then applied.

As aforementioned, the odd numbered flip-flops FF11 and FF13 and the even numbered flip-flops FF12 and FF14 with are independently driven and sequentially output scan signals every two horizontal periods. The output from the odd numbered flip-flops FF11 and FF13 and the even numbered flip-flops FF12 and FF14 have time difference for one horizontal period. Therefore, considering the whole configuration of the shift register unit, the scan signals are sequentially outputted every horizontal period from the odd numbered flip-flops FF11 and FF13 and the even numbered flip-flops FF12 and FF14.

The first and second gate start voltages Vst11 and Vst12 may be combined into one gate start voltage. That is, a gate start voltage is simultaneously applied to the first flip-flop FF11 and the second flip-flop FF12. The second flip-flop FF12 charges the first Node ND11 by the gate start voltage at the same time point as the first flip-flop FF11. However, the second flip-flop FF12 can not output the scan signal Vout12 before the second clock signal C12 is applied, which is outputted one horizontal period later as compared with the first clock signal C11, is applied thereto, so as to be in a stand-by state for one horizontal period. Therefore, when outputting the first and second gate start voltages Vst11 and Vst12 independently, the first and second flip-flops FF11 and FF12 can equally be driven.

Furthermore, when the first and second gate start voltages Vst11 and Vst12 are combined into one gate start voltage simultaneously applied to the first and second flip-flops FF11 and FF12, the type of the first transistor T1 should be transformed into a diode type in which the drain electrode and the gate electrode are electrically short-circuited. If the first transistor T11 is not transformed but used as it is, current may flow toward the high potential voltage Vdd when performing a bootstrapping by the clock signals C11 to C14 so as to be impossible to achieve effect of the bootstrapping.

As described so far, by configuring the shift register unit as aforementioned, although scan signals are sequentially outputted every horizontal period as in the related art, charging time of the first and second Nodes ND11 and ND12 of each flip-flop is increased twice to charge the first and second Nodes ND11 and ND12 to the desired voltage level, whereby the eighth transistor T18 and the ninth transistor T19 are turned on by a high voltage to thereby rapidly rise pulses of the scan signals Vout11 to Vout14 to high potential levels and rapidly falling them into low potential levels. As a result, a falling time of the pulses of the scan signals Vout11 to Vout14 is shortened and thus the pulses are closer to the shapes of normal square waves. Therefore, scan signals can be outputted for one frame and the shift register unit can easily be applied to the liquid crystal display device with high resolution. Furthermore, the scan signal with the desired voltage level can be outputted to gate lines to thereby improve image quality of the liquid crystal display device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A driving unit for a liquid crystal display device which includes a plurality of gate lines and data lines arranged horizontally and longitudinally on a substrate, and a plurality of pixels arranged on the substrate along each gate line, comprising:
    a first group of driving stages made of odd numbered stages being disposed in odd numbered rows for receiving a high potential voltage and a low potential voltage, being set by a first gate start voltage from the exterior, and applying a scanning signal to the gate lines of odd numbered row by being synchronized with a first clock signal and a second clock signal, the first and second clock signals alternately applied to the odd numbered row, the first and second clock signals having two horizontal periods; and
    a second group of driving stages made of even numbered stages being disposed in even numbered rows for receiving the same high potential voltage and low potential voltage, being set by a second gate start voltage from the exterior, and applying a scanning signal to the gate lines of even numbered row by being synchronized with a third clock signal and a fourth clock signal, the third and fourth clock signals alternately applied to the even numbered row, the third and fourth clock signals having two horizontal periods,
    wherein the odd numbered stages and the even numbered stages are alternatingly disposed with respect to each other in parallel so that one odd numbered stage is immediately positioned below or above one even numbered stage,
    wherein all the odd numbered stages and the even numbered stages receive the same high potential voltage through a single high potential voltage line, and all the odd numbered stages and the even numbered stages receive the same low potential voltage through a single low potential voltage line,
    wherein the first group and the second group are individually driven by the first gate start voltages and the second gate start voltage,
    wherein the first gate start voltage and the second gate start voltage are simultaneously applied to the first stage of the first group and the first stage of the second group,
    wherein the first gate start voltage is applied two horizontal periods prior to the first clock signal of the first group and the first clock signal of the first group is applied two horizontal periods prior to the second clock signal of the first group, and the second gate start voltage is applied two horizontal periods prior to the third clock signal of the second group and the third clock signal of the second group is applied two horizontal periods prior to the fourth clock signal of the second group,
    wherein the first, second, third and fourth clock signals all have a same polarity,
    wherein each of the odd and even numbered stages outputs scanning signals to sequentially drive the gate lines by being synchronized with the first and second clock signals, and the third and fourth clock signals,
    wherein each of the odd and even numbered stages except for the first stage of the first group and the first stage of the second group uses a scanning signal of the previous stage in the same group as a gate start voltage by being arranged alternately each other, and
    wherein each of the odd and even numbered stages except for the last stage of the first group and the last stage of the second group uses a scanning signal of the next stage in the same group as a gate stop voltage by being arranged alternately each other, wherein a scanning signal output from one of the driving stages in the first or second group is output to one of the gate lines and at the same time, is input directly to a transistor of the next stage in the same group, wherein said transistor is directly connected to a gate electrode of a different transistor, and said different transistor turns a corresponding stage scanning signal into the low potential.

2. The driving unit of claim 1, wherein the scanning signal outputted by one driving stage of the first group is sent to a next preceding driving stage of the first group, and the scanning signal outputted by one driving stage of the second group is sent to a next preceding driving stage of the second group.

3. The driving unit of claim 1, wherein the driving stages of the first group and the second group alternately output the scanning signals every one horizontal period.

4. The driving unit of claim 3, wherein the output period of the driving stages of the first group is two horizontal periods.

5. The driving unit of claim 3, wherein the output period of the driving stages of the second group is two horizontal periods.

6. The driving unit of claim 1, wherein pulses of the scanning signals which are sequentially outputted from the driving stages of the first group and the driving stages of the second group are overlapped as much as one horizontal period.

7. The driving unit of claim 1, wherein each pulse width of the first gate start voltage and the second gate start voltage is two horizontal periods.

8. The driving unit of claim 1, wherein the first clock signal and the second clock signal of the first group and the third clock signal and the fourth clock signal of the second group, respectively, are applied to the driving stages of the first group and the driving stages of the second group every two horizontal period.

9. The driving unit of claim 8, wherein both the first clock signal and the second clock signal have a pulse width of two horizontal periods.

10. The driving unit of claim 1, wherein each scanning signal from the driving stages of the first group and each scanning signal from the driving stages of the second group have a pulse width of two horizontal periods.

11. The driving unit of claim 10, wherein image information is applied to pixels for one of two horizontal periods of the scanning signals.

12. A liquid crystal display device, comprising:
a liquid crystal panel which includes a plurality of gate lines and data lines arranged substantially perpendicularity on a substrate, and a plurality of pixels arranged on the substrate along each gate line; and
a driving driver including a first group of driving stages made of odd numbered stages being disposed in odd numbered rows for being set by a first gate start voltage and a second group of driving stages made of even numbered stages being disposed in even numbered rows for being set by a second gate start voltage, wherein the odd numbered stages output scanning signals to sequentially drive the gate lines by being synchronized with a first clock signal and a second clock signal, the first and second clock signals are alternately applied to the odd numbered row, and the first and second clock signals have two horizontal periods, wherein the even numbered stages output scanning signals to sequentially drive the gate lines by being synchronized with a third clock signal and a fourth clock signal, the third and fourth clock signals are alternately applied to the even numbered row, and the third and fourth clock signals have two horizontal periods, wherein the odd numbered stages and the even numbered stages are alternatingly disposed with respect to each other in parallel so that one odd numbered stage is immediately positioned below or above one even numbered stage, wherein all the odd numbered stages and the even numbered stages receive a same high potential voltage through a single high potential voltage line, and all the odd numbered stages and the even numbered stages receive a same low potential voltage through a single low potential voltage line, wherein the first group and the second group are individually driven by the first gate start voltages and the second gate start voltage, wherein the first start voltage and the second start voltage are applied to the first stage of the first group and the first stage of the second group, wherein the first gate start voltage is applied two horizontal periods prior to the first clock signal of the first group and the first clock signal of the first group is applied two horizontal periods prior to the second clock signal of the first group, and the second gate start voltage is applied two horizontal periods prior to the third clock signal of the second group and the third clock signal of the second group is applied two horizontal periods prior to the fourth clock signal of the second group, wherein the first, second, third and fourth clock signals all have a same polarity, wherein each of the odd and even numbered stages except for the first stage of the first group and the first stage of the second group uses a scanning signal of the previous stage in the same group as a start voltage by being arranged alternately each other, and wherein each of the odd and even numbered stages except for the last stage of the first group and the last stage of the second group uses a scanning signal of the next stage in the same group as a stop voltage by being arranged alternately each other, wherein a scanning signal output from one of the driving stages in the first or second group is output to one of the gate lines and at the same time, is input directly to a transistor of the next stage in the same group, wherein said transistor is directly connected to a gate electrode of a different transistor, and said different transistor turns a corresponding stage scanning signal into the low potential.

13. The device of claim 12, wherein a high level time portion of the clock signal received by one of the driving stages is ahead of a high level time portion of the clock signal received by the next subsequent driving stage for the half of the high level time portion.

14. The device of claim 13, wherein the scanning signal outputted by the one of the driving stages overlaps and is ahead of the scanning signal outputted by the next subsequent driving stage for the half of the high level time portion.

15. The device of claim 12, wherein the clock signal received by one of the driving stages is complementary to the clock signal received by a second next subsequent driving stage.

16. The device of claim 12, wherein the scanning signal outputted by one of the driving stages is received by a second next subsequent driving stage with respect to the one of the driving stages for driving the second next subsequent driving stage.

17. The device of claim 16, wherein the scanning signal outputted by the second next subsequent driving stage with respect to the one of the driving stages is received by the one of the driving stages for stopping driving the one of the driving stages.

18. The device of claim 12, wherein the first gate start voltage is applied to the first group for two horizontal periods, and after one horizontal period, the second gate start voltage is applied to the second group for two horizontal periods so that the first gate start voltage is overlapped with the second gate start voltage for one horizontal period.

19. The device of claim 12, wherein the first gate start voltage and the second gate start voltage are simultaneously applied to the first stage of the first group and the first stage of the second group.

20. A driving unit for a liquid crystal display device, the driving unit comprising:
   a plurality of stages driven by at least one start signal and first to fourth clock signals, and connected to each other in parallel,
   wherein a K-th stage among the plurality of stages is set by at least one among the first to fourth clock signals, where K is a positive integer,
   wherein an output signal of the K-th stage is input to a (K−2)-th stage as a reset signal of the (K−2)-th stage, and is input to a (K+2)-th stage as a set signal of the (K+2)-th stage,
   wherein the K-th stage is positioned directly below a (K−1)-th stage or directly above a (K+1)-th stage,
   wherein all the plurality of stages receive a same high potential voltage through a single high potential voltage line, and all the plurality of stages receive a same low potential voltage through a single low potential voltage line,
   wherein the first and second clock signals are alternately applied to odd numbered rows of the plurality of stages, and the first and second clock signals have two horizontal periods,
   wherein the third and fourth clock signals are alternately applied to even numbered rows of the plurality of stages, and the third and fourth signals have two horizontal periods, and
   wherein the first, second, third and fourth clock signals all have a same polarity,
   wherein the output signal output from the K-th stage is output to one of gate or data lines for driving said one of gate or data lines, and at the same time, is input directly to a transistor of the (K+2)-th stage, wherein said transistor of the (K+2)-th stage is directly connected to a gate electrode of a different transistor of the (K+2)-th stage, and said different transistor of the (K+2)-th stage turns the (K+2)-th stage output signal into the low potential.

21. The driving unit of claim 20, wherein each stage comprises:
   a first transistor including a gate on which the start signal is inputted, a drain is supplied a driving voltage, and a source connected with a first node;
   a second transistor including a gate and a drain on which the driving voltage is supplied, and a source connected with a second node;
   a third transistor including a gate connected with the second node, a drain connected with the first node, and a source connected with a ground voltage;
   a fourth transistor including a gate connected with a third node, a drain connected with the first node, and a source connected with the ground voltage;
   a fifth transistor including a gate connected with the first node, a drain connected with the second node, and a source connected with the ground voltage;
   a sixth transistor including a gate on which the start signal is inputted, a drain connected with the second node, and a source connected with the ground voltage;
   a seventh transistor including a gate connected with the third node, a drain connected with the driving voltage, and a source connected with the second node;
   an eighth transistor including a gate connected with the first node, a drain on which the clock signal is inputted, and a source connected with an output terminal; and
   a ninth transistor including a gate connected with the second node, a drain connected with an output terminal, and a source connected with the ground voltage.

22. The driving unit of claim 21, wherein the first node is charged during two horizontal periods.

23. The driving unit of claim 20, wherein the plurality of stages comprise odd numbered stages disposed in odd numbered rows and even numbered stages disposed in even numbered rows.

24. The driving unit of claim 20, wherein an image information is applied into pixels during one of two horizontal periods of scanning signals.

25. The driving unit of claim 20, wherein the first to fourth clock signals have sequentially a phase difference of one horizontal period.

* * * * *